United States Patent [19]
Ji et al.

[11] Patent Number: 5,589,084
[45] Date of Patent: Dec. 31, 1996

[54] THIN FILM ACTUATED MIRROR ARRAY

[75] Inventors: Jeong B. Ji, Seoul, Rep. of Korea; Gregory Um, Torrance, Calif.

[73] Assignees: Daewoo Electronics Co. Ltd., Seoul, Rep. of Korea; Aura Systems, Inc., El Segundo, Calif.

[21] Appl. No.: 480,032

[22] Filed: Jun. 7, 1995

Related U.S. Application Data

[62] Division of Ser. No. 200,861, Feb. 23, 1994, Pat. No. 5,481,396.

[51] Int. Cl.$^6$ ............................................. B44C 1/22
[52] U.S. Cl. ................................... 216/24; 216/97
[58] Field of Search .................... 216/24, 26, 41, 216/97; 359/295

[56] References Cited

U.S. PATENT DOCUMENTS

| | | | |
|---|---|---|---|
| 4,885,055 | 12/1989 | Woodbury et al. | 216/26 |
| 5,364,742 | 11/1994 | Fan et al. | 216/97 X |

*Primary Examiner*—William Powell
*Attorney, Agent, or Firm*—Anthony T. Cascio; Lisa A. Merkadeau

[57] ABSTRACT

A thin film actuated mirror for an actuated mirror array includes a pedestal and at least piezoelectric structure cantilevered from the pedestal. The piezoelectric structure includes a layer of piezoelectric material having two opposing surfaces. Each of two metal electrodes are mounted on a respective one of the opposing surfaces of the piezoelectric material layer. An electrical signal is applied across the piezoelectric material, between the electrodes, causing deformation of the piezoelectric material. The thin film actuated mirror further includes a mirror surface interconnected to the piezoelectric material layer such that the mirror surface deforms in response to the deformation of the piezoelectric material layer.

3 Claims, 4 Drawing Sheets

THIN FILM ACTUATED MIRROR ARRAY

This is a divisional of application(s) Ser. No. 08/200,861, filed Feb. 23, 1994, now U.S. Pat. No. 5,481,396.

FIELD OF THE INVENTION

The present invention relates generally to actuated mirror arrays for optical projection video systems, and more particularly to thin film actuated mirror arrays for optical projection systems.

BACKGROUND OF THE INVENTION

In a particular type of an optical projection video display system, an actuated mirror array is used to control the light modulation for each pixel. In one system, the mirror array is illuminated by a source of optical energy. Under electronic control, the orientation of each of the mirrors in the array is varied to determine a propagation path for a beam of light reflecting from each mirror. An example of an optical projection video display system is shown in FIG. 1. In this system light is emitted from a light source 120, and is reflected off a Schtieren stop mirror 122 at an angle toward the actuated mirror array 124. The light is reflected from the actuated mirror array at a controlled angle. The angle is controlled through the actuation of the mirror array. The light reflected from the mirror array 124 passes through a second lens 126, bypasses the Schlieren stop mirror, and passes through a third lens 128 to a screen. The present invention discloses actuated mirrors for mirror arrays used in such an optical projection video display system.

A unimorph is a piezoelectric element externally bonded to a metal foil. The metal foil is controlled by applying a DC electrical signal across the piezoelectric material, which causes the piezoelectric material to change shape. The change in shape of the piezoelectric material causing an axial buckling or deflection in the metal foil as the foil opposes movement of the piezoelectric material. The degree of buckling of the metal foil is controlled by the amplitude of the DC electrical signal. A bimorph includes two layers of piezoelectric element. It is known in the art to create unimorph and bimorph piezoelectric elements by using adhesives to bond the metal foil to the piezoelectric elements. For example, U.S. Pat. No. 5,085,497 discloses methods for fabricating mirror arrays for optical projection systems.

A problem with the known actuated mirror arrays, however, is that the mirror arrays are difficult to manufacture. Another problem with the known actuated mirror arrays is that displacement of the mirrors is not as great as desired. For these reasons, an improved actuated mirror array is needed.

SUMMARY OF THE INVENTION

Accordingly, it is a primary object of the present invention to overcome one or more disadvantages and limitations of the prior art. A significant object of the present invention is to provide an actuated mirror array having a high fill factor.

Another aspect of the present invention is to provide a method of easily fabricating actuated mirror arrays utilizing thin film techniques.

According to a broad aspect of the present invention, a thin film actuated mirror for an actuated mirror array comprises a pedestal and at least piezoelectric structure cantilevered from the pedestal. The piezoelectric structure includes a layer of piezoelectric material having two opposing surfaces. Each of two metal electrodes are mounted on a respective one of the opposing surfaces of the piezoelectric material layer. An electrical signal is applied across the piezoelectric material, between the electrodes, causing deformation of the piezoelectric material. The thin film actuated mirror further comprises a mirror surface interconnected to the piezoelectric material layer such that the mirror surface deforms in response to the deformation of the piezoelectric material layer.

A feature of the present invention is that the thin film actuated mirror arrays are easily manufactured.

Another feature of the present invention is that the thin film actuated mirror arrays are efficient in utilizing the mirror area.

These and other objects, advantages and features of the present invention will become readily apparent to those skilled in the art from a study of the following description of an exemplary preferred embodiment when read in conjunction with the attached drawing and appended claims.

DESCRIPTION OF AN EXEMPLARY PREFERRED EMBODIMENT

Figure 1:
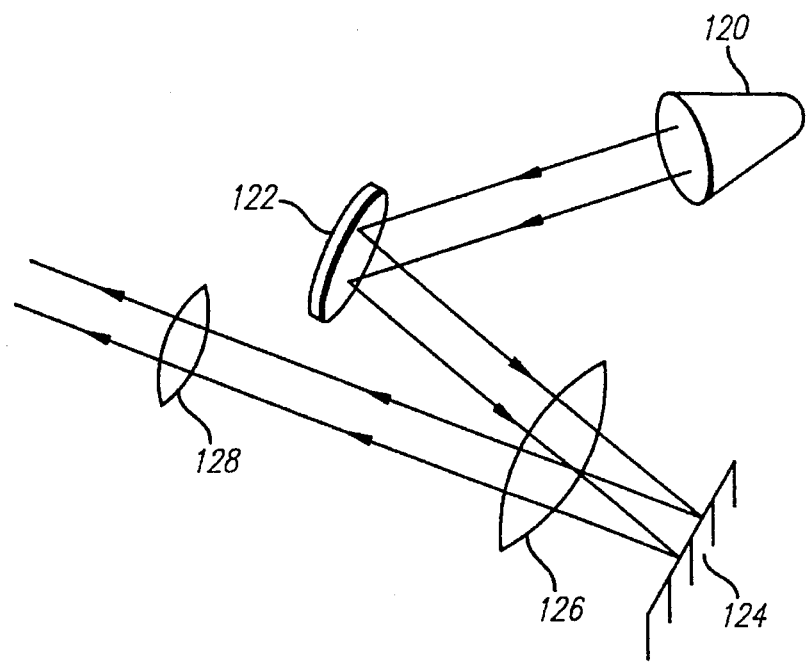
FIG. 1 is a diagram showing an optics implementation of the thin film actuated mirror array.
Figure 2:
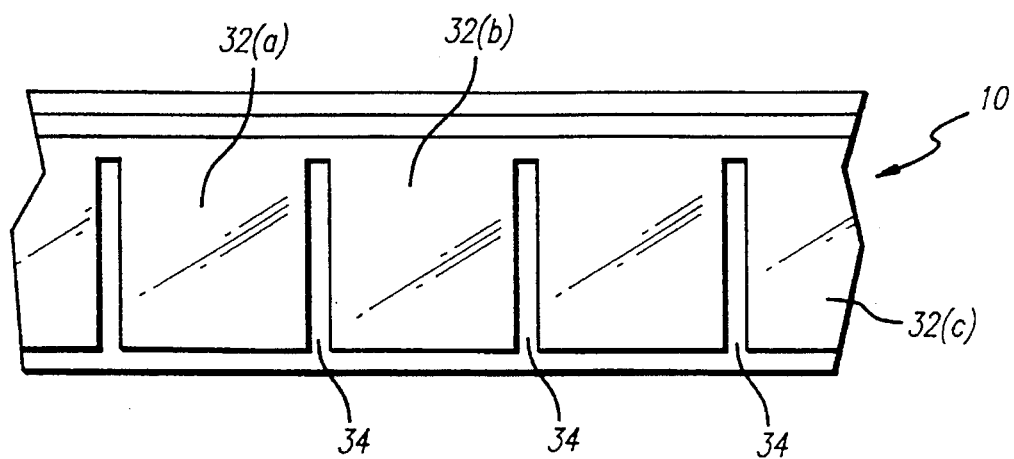
FIG. 2 is a plan view of a first embodiment of a thin film actuated mirror array in a unimorph form.
Figure 3:
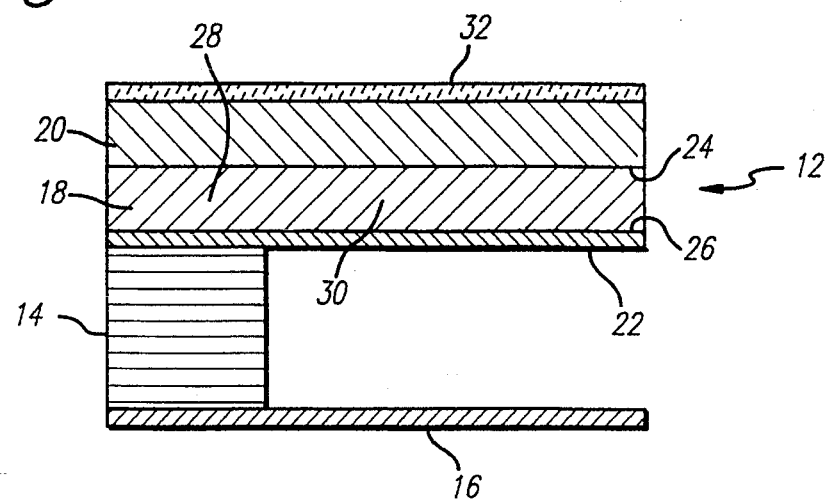
FIG. 3 is a side view of the first embodiment of the unimorph actuated mirror array of FIG. 2 in an unactuated state.
Figure 4:
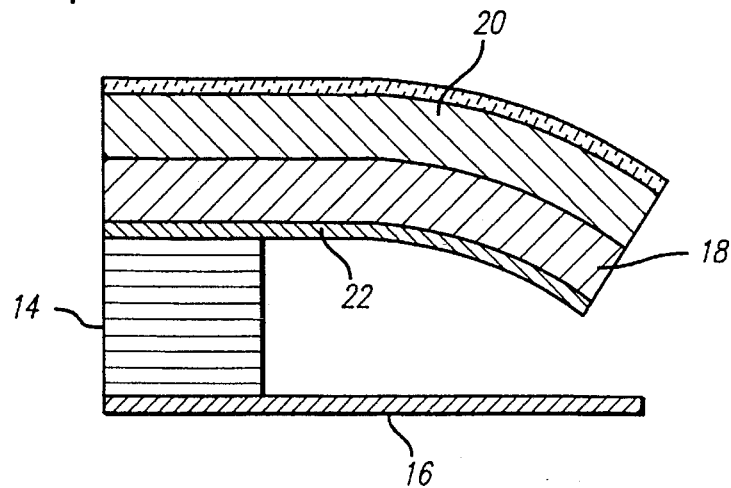
FIG. 4 is a side view of the first embodiment of the unimorph actuated mirror array of FIG. 2 in an actuated state.

Referring first to FIGS. 2, 3, and 4, a first embodiment 10 of a thin film actuated mirror array of the present invention is described. The first embodiment 10 includes a piezoelectric structure 12, a pedestal member 14, and a substrate 16. The piezoelectric structure 12 includes a layer of piezoelectric material 18 disposed intermediate a first layer of metal 20 and a second layer of metal 22. The piezoelectric material layer 18 has an upper surface 24 and a lower surface 26. The first layer of metal 20 is in contact with the upper surface 24 of the piezoelectric material layer and functions as a reflective mirror surface 32 and a metal electrode. The reflective mirror surfaces 32 are coupled to ground across the lengths of rows and columns of the array. The second layer of metal 22 is in contact with the lower surface 26 of the piezoelectric material layer and also functions as a metal electrode. The piezoelectric structure 12 is supported in a cantilevered fashion by the pedestal member 14. The pedestal member 14 is coupled to the substrate 16.

In this first embodiment of the present invention, the piezoelectric structure 12 includes a first portion 28 mounted to the pedestal 14 and a second portion 30 cantilevered from the pedestal 14. An electrical field is applied across the piezoelectric structure 12 from the substrate active matrix through the pedestal 14 which conducts the electrical signal. The application of the electric field will either cause the piezoelectric material to contract or expand, depending on the polarity of the electric field with respect to the poling of the piezoelectric material. By way of example, if the polarity of the electric field corresponds to the polarity of the piezoelectric material, the piezoelectric material will contract. If the polarity of the electric field is opposite the polarity of the piezoelectric material, the piezoelectric material will expand.

With reference to FIGS. 3 and 4 the polarity of the piezoelectric material corresponds to the polarity of the applied electric field, causing the piezoelectric material to contract. Because the inactive first layer of metal 20 does not contract, the piezoelectric structure 12 bends downward, as shown in FIG. 4. Referring now to FIGS. 3 and 4, it is shown that the light impinging the mirror surface 32 of the actuated piezoelectric structure of FIG. 4 is deflected at a larger angle than the light deflected from the mirror surface 32 of the unactuated piezoelectric structure shown in FIG. 3.

Alternatively, an electric field of a reverse polarity may be applied across the piezoelectric layer 18, causing the piezoelectric material to expand. In this example, the inactive first layer of metal does not expand, and as a result, the piezoelectric structure 12 bends upward (not shown). The light impinging the mirror surface 32 of the upwardly actuated piezoelectric structure is deflected at a smaller angle than the light deflected from the mirror surface 32 of the unactuated piezoelectric structure shown in FIG. 3.

As best shown in FIG. 2, the first embodiment of the present invention includes mirror dividing slots 34 in the reflective mirror surface 32 that divide the reflective mirror surface 32 into a plurality of mirror segments 32(a), 32(b), 32(c). The slots 34 correspond to divisions between the pixels, and therefore, the mirror segments correspond to the pixels. The mirror dividing slots 34 allow for independent motion of each of the mirror segments and therefore independent reaction in each pixel. The slots 34, however, do not completely disconnect the mirror segments from each other to allow for common ground connection.

The method of fabricating the first embodiment of the present invention is now described. First, the active matrix substrate 16 is provided. A first layer is then applied to the substrate 16. A first area of the first layer corresponds to the pedestal member 14. A second area of the first layer corresponds to the area of the second portion 30 of the piezoelectric structure 12. This second area of the first layer is treated so as to be a sacrificial layer. Therefore, the second area of the first layer is removable by etching or the application of chemicals. The second thin film layer of metal 22, the layer of piezoelectric material 18, and the first thin film layer of metal 20 are then respectively deposited on the first layer. The layers of metal and piezoelectric material may be deposited and patterned with the known thin film techniques, such as sputtering, sol gel, evaporation, etching and micro-machining. The sacrificial second area of the first layer is next dissolved or removed by the application of a chemical, leaving the three layers of the second portion of the piezoelectric structure spaced apart from the substrate. As a result, the piezoelectric structure is cantilevered from the pedestal member 14.

Figure 5:
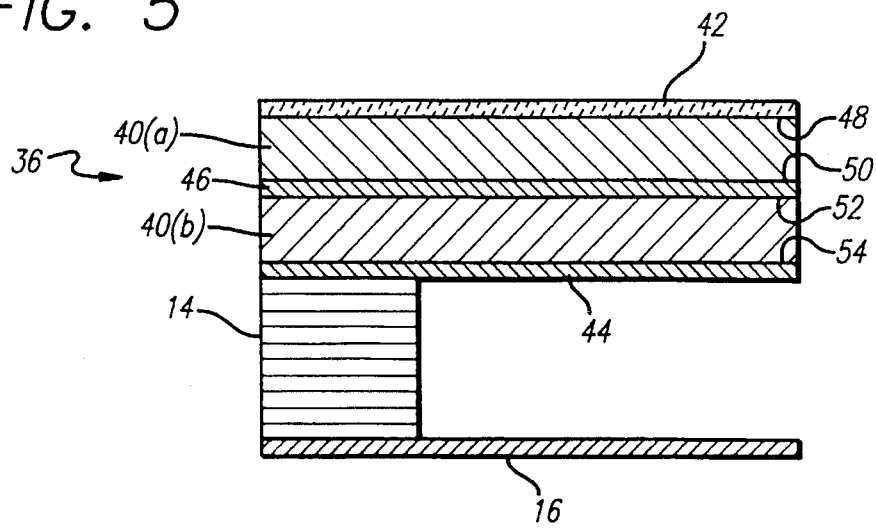
FIG. 5 is a side view of a second embodiment of a thin film actuated mirror array in a bimorph form.

Referring now to FIG. 5, a second embodiment 36 of the thin film actuated mirror array is shown. The second embodiment 36 is comprised of a bimorph structure. More specifically, the bimorph structure includes a bimorph piezoelectric structure 38 having an upper piezoelectric material layer 40($a$), a lower piezoelectric material layer 40($b$), a first layer of metal 42, a second layer of metal 44, and a third layer of metal 46. The upper piezoelectric material layer 40($a$) defines an upper surface 48 and a lower surface 50. The first layer of metal 42 is disposed in contact with the upper surface 48 and functions as a reflective mirror surface 32. The lower piezoelectric material layer 40($b$) also defines an upper surface 52 and a lower surface 54. The second layer of metal 44 is disposed in contact with the lower surface 54 and functions as a metal electrode. The third layer of metal 46 is disposed intermediate and in contact with the upper piezoelectric material layer lower surface 50 and the lower piezoelectric material layer upper surface 52.

In the second embodiment 36 of the invention shown in FIG. 5, the bimorph piezoelectric structure 38 also includes a first portion 28 mounted to the pedestal 14 and a second portion 30 cantilevered from the pedestal 14. When electric fields are applied across the piezoelectric material layers 40($a$), 40($b$), the piezoelectric structure 38 will either bend upward or downward, depending on the poling of the piezoelectric material and the polarity of the electric fields. For example, if the polarity causes the upper piezoelectric material layer 40($a$) to contract, and the lower piezoelectric material layer 40($b$) to expand$_d$, the piezoelectric structure 38 will bend upward. In this situation, the impinging light is deflected at a smaller angle from the actuated piezoelectric structure than the deflected light from the unactuated piezoelectric structure. However, if the polarity of the piezoelectric material and the electric field causes the upper piezoelectric material layer 40($a$) to expand, and the lower piezoelectric material layer 40($b$) to contract, the piezoelectric structure 38 will bend downward. In this situation, the impinging light is deflected at a larger angle from the actuated piezoelectric structure than the deflected light from the unactuated piezoelectric structure.

The second embodiment 36 is fabricated in a similar manner as the first embodiment 10. A first layer is applied to the substrate 16. The first layer includes a first area corresponding to the pedestal member 14 and a second treated area corresponding to the second portion 30 of the piezoelectric structure 12. The second thin film layer of metal 44, the first layer of piezoelectric material 40($b$), the third layer of metal 46, the first layer of piezoelectric material 40($a$), and the first layer of metal and the first thin film layer of metal 42 are then deposited respectively on the first layer. The layers of metal and piezoelectric material may be deposited and patterned with the known thin film techniques. The sacrificial second area of the first layer is next dissolved or removed by the application of a chemical, leaving the bimorph piezoelectric structure 38 cantilevered from the pedestal member 14.

Figure 6:
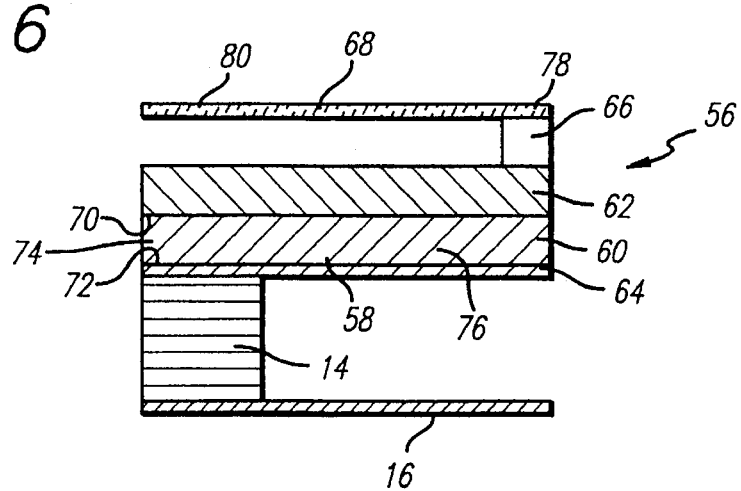
FIG. 6 is a plan view of a third embodiment of a thin film actuated mirror array.
Figure 7:
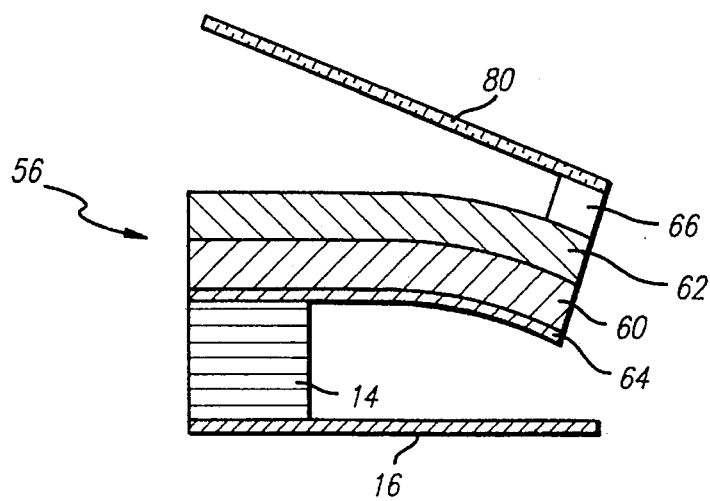
FIG. 7 is a side view of the third embodiment of the actuated mirror array of FIG. 6 in an actuated state.

Referring now to FIGS. 6 and 7, a third embodiment 56 of the thin film actuated mirror array is shown with a unique piezoelectric structure 58. The piezoelectric structure 58 includes a piezoelectric material layer 60, a first metal layer 62, a second metal layer 64, a spacer 66, and a mirror layer 68. The piezoelectric material layer 60 defines an upper surface 70 and a lower surface 72. The first metal layer 62 is deposited in contact with the upper surface 70. The first layer of metal 64 is deposited in contact with the lower surface 72. The first and second metal layers 62, 64 serve as metal electrodes. The piezoelectric structure is mounted to the pedestal member 14 at a proximal end 74 of the piezoelectric material layer, and the spacer 66 is disposed on a distal end 76 of the piezoelectric material layer. A first portion 78 of the mirror layer 68 is secured to the spacer such that a second portion 80 of the mirror layer 68 is cantilevered from the pedestal 14.

As shown in FIG. 7, when an electric field is applied across the piezoelectric material causing the, piezoelectric structure 58 to bend upward, the mirror 68 will tilt upward at an angle, but remain planar. As a result, the effective length of the mirror 68 is the entire length of the mirror, in comparison, if the mirror layer 68 is directly secured to the piezoelectric material layer, the portion of the mirror secured to the pedestal does not deform in reaction to the electric field, but instead remains securely in place. As a result, the effective length of the mirror is the length if the mirror less the length of the portion of the piezoelectric material secured to the pedestal. The implementation of the spacer 88 and mirror layer 68 in the embodiment shown in FIG. 7 therefore increases the fill factor and efficiency of the mirror array. As an additional benefit, the thickness of the mirror layer 68 is easily varied.

Figure 8:
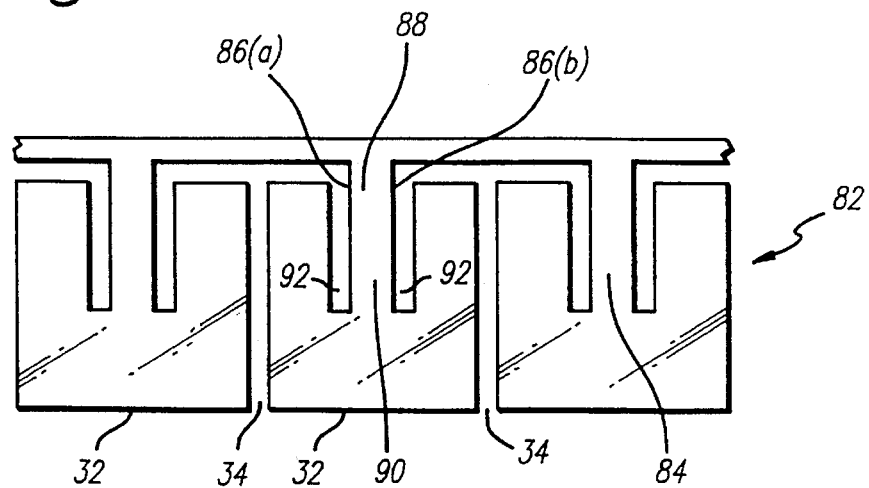
FIG. 8 is a plan view of a fourth embodiment of a thin film actuated mirror array.
Figure 9:
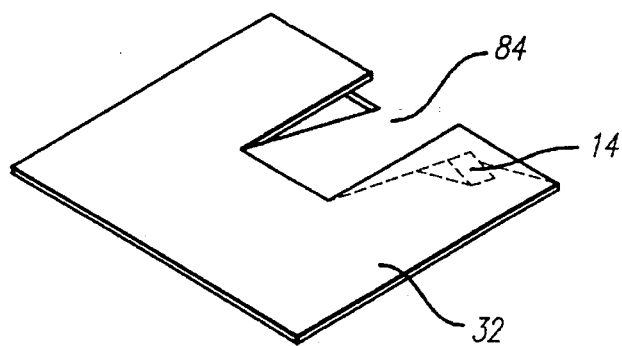
FIG. 9 is a perspective view of the fourth embodiment of the thin film actuated mirror array of FIG. 8.

Referring now to FIGS. 8 and 9, a fourth embodiment 82 of a thin film actuated mirror array is shown. In this embodiment, each of the mirror segments is separated by a plurality of mirror dividing slots 34 as described with reference to FIG. 2. Each mirror segment 32 further includes a piezoelectric structure in the form of a central tab portion 84. The central tab portion 84 is secured to the pedestal member 14. The central tab portion defines two opposing elongated sides 86(a), 86(b), a first or proximal end 88 and a second or distal end 90. The proximal end 88 of the central tab portion 84 is directly attached to the pedestal member 14. The two elongated sides are each detached from the mirror segment by a narrow opening 92. Therefore, the mirror segment 32 surrounding the proximal end 88 and the two elongated sides 86(a), 86(b) of the central tab portion 84 is not directly secured to the pedestal member 14, but the mirror segment is directly secured to the distal end 90 of the central tab portion.

The central tab portion 84 is comprised of the piezoelectric material layer disposed intermediate the two metal electrode layers. Therefore, when an electric field is applied to the piezoelectric material layer tab portion 84, the tab portion bends upward or downward depending on the poling of the piezoelectric material and the polarity of the field. If the central tab portion 84 bends upward, the mirror segment 32 remains substantially planar, but tilts or pivots upward at an angle. If the central tab portion 84 bends downward, the mirror segment 32 remains substantially planar, but tilts or pivots downward at an angle. Because the mirror segment 32 is not directly secured to the piezoelectric tab portion 84, and is instead in a hinged-type of relationship to the distal end 90 of the tab portion, the entire area of the mirror segment 32 is utilized for light deflection. As a result, the efficiency of the mirror array is higher than if the mirror segments were in a fixed relationship to the piezoelectric material and the tilting angle of the mirror segment 32 is maximized.

Figure 10:
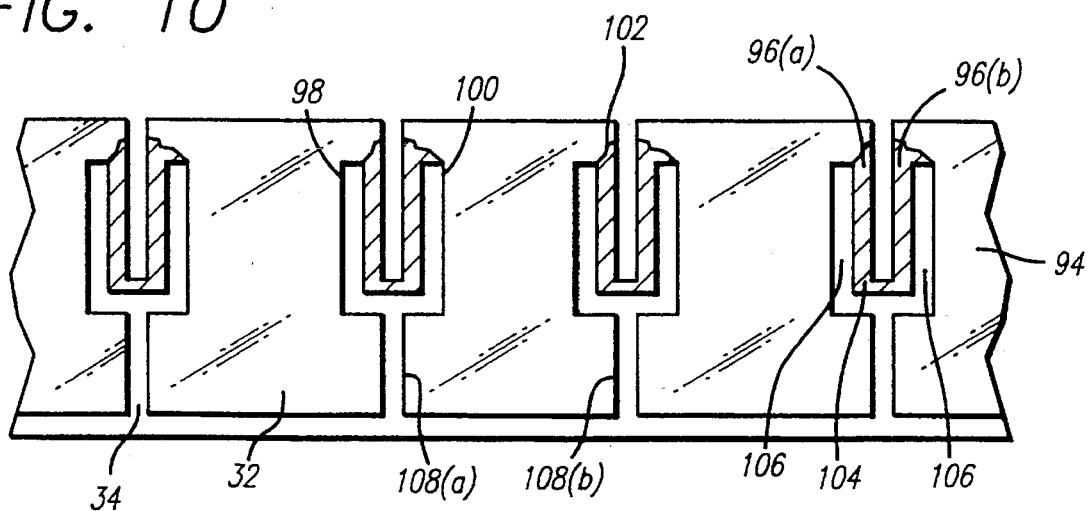
FIG. 10 is a plan view of a fifth embodiment of a thin film actuated mirror array.
Figure 11:
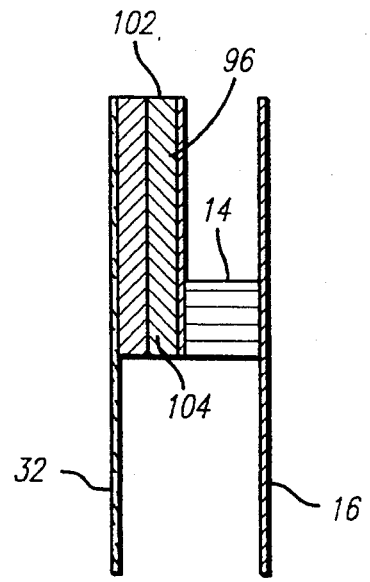
FIG. 11 is a side view of the fifth embodiment of the thin film actuated mirror array shown in FIG. 10.

Referring now to FIGS. 10 and 11, a fifth embodiment 94 of a thin film actuated mirror array is shown. For purposes of reference, in this embodiment, the mirror segment defines two opposing sides 108(a), 108(b). The piezoelectric structure is comprised of two side tab portions 96(a) and 96(b) that correspond to and align with the two mirror segment sides 108(a), 108(b) of each mirror segment. As shown in FIG. 10, each of the side tab portion 96(a) and 96(b) defines a first elongated side 98, a second opposing elongated side 100, a first or proximal end 102, and a second or distal end 104. The first elongated side 98 is adjacent the slot 34 that separates the mirror segments. The second opposing elongated side 100 is separated from the mirror segment 32 by a narrow open slit 106.

The second or distal end 104 of each of the side tab portions 96(a) and 96(b) is secured to the pedestal member 14. Therefore, the pedestal is approximately centered below the mirror segment, as best shown in FIG. 11. The first or proximal end 102 of each of the side tab portions 96(a) and 96(b) is directly connected to the mirror segment 32. However, the distal end 104 and elongated sides 98, 100 of each of the side tab portions 96(a) and 96(b) are not directly connected to the mirror segment 32. The side tab portions 96(a) and 96(b) are comprised of the piezoelectric material layer disposed intermediate the two metal electrodes. Therefore, when an electric field is applied across the piezoelectric material tab members, the tab members bend upward or downward, depending on the poling of the piezoelectric material and the polarity of the electric field. If the tab portions bend upward, the associated mirror segment tilts or pivots upward at an angle, but remains substantially planar. If time tab portions bend downward, the associated mirror segment tilts or pivots downward at an angle, but remains substantially planar. Therefore, two side tab portions 96 operate like hinges for each mirror segment. As a result, the efficiency of the mirror array is greater than if the mirror segment was in a fixed relationship to the piezoelectric material.

It is to be noted that the third, fourth, and fifth embodiments of this invention may utilize a bimorph structure. It is also to be noted that, although the descriptions of the embodiments refer to piezoelectric material, other type of motion-inducing material may be used. For example, electrostrictive or magnetostrictive material may be used to obtain the desired expansion of shrinkage.

There has been described hereinabove several exemplary preferred embodiments of the thin film actuated mirror array according to the principles of the present invention. Those skilled in the art may now make numerous uses of, and departures from, the above-described embodiments without departing from the inventive concepts disclosed herein. Accordingly, the present invention is to be defined solely by the scope of the following claims.

I claim as my invention:

1. A method of fabricating a thin film mirror for an optical projection system comprising the steps of:

providing an active matrix substrate;

depositing a first layer to the substrate, the first layer including a first area corresponding to a pedestal member of the thin film mirror and a second sacrificial area corresponding to the remaining area of the thin film mirror area;

treating the second sacrificial area of the first layer so as to be removable;

depositing a thin film layer of metal on the first layer;

depositing a thin film layer of piezoelectric material on the thin film layer of metal;

depositing a second thin film layer of metal on the piezoelectric material layer; and removing the second sacrificial area of the first layer.

2. A method of fabricating a thin film mirror for an optical projection system in accordance with claim 1 wherein the step of removing the second sacrificial area of the first layer comprises the step of dissolving the second sacrificial area of the first layer with a chemical.

3. A method of fabricating a thin film mirror for an optical projection system in accordance with claim 1 wherein the step of removing the second sacrificial area of the first layer comprises the step of etching the second sacrificial area of the first layer.

\* \* \* \* \*